US00RE48015E

(19) United States
(12) Reissued Patent
Refai-Ahmed et al.

(10) Patent Number: US RE48,015 E
(45) Date of Reissued Patent: May 26, 2020

(54) INTERCONNECT DEVICES FOR ELECTRONIC PACKAGING ASSEMBLIES

(71) Applicant: General Electric Company, Schenectady, NY (US)

(72) Inventors: Gamal Refai-Ahmed, Santa Clara, CA (US); David Mulford Shaddock, Troy, NY (US); Arun Virupaksha Gowda, Rexford, NY (US); John Anthony Vogel, Charlton, NY (US); Christian Michael Giovanniello, Schenectady, NY (US)

(73) Assignee: General Electric Company, Schenectady, NY (US)

(21) Appl. No.: 15/886,478

(22) Filed: Feb. 1, 2018

Related U.S. Patent Documents

Reissue of:
(64) Patent No.: 9,252,138
Issued: Feb. 2, 2016
Appl. No.: 14/287,237
Filed: May 27, 2014

(51) Int. Cl.
*H01L 33/02* (2010.01)
*H01L 25/16* (2006.01)
(Continued)

(52) U.S. Cl.
CPC ..... *H01L 25/167* (2013.01); *H01L 23/5386* (2013.01); *H01L 25/50* (2013.01);
(Continued)

(58) Field of Classification Search
CPC ..... H01L 25/167; H01L 25/50; H01L 33/62; H01L 33/647; H01L 33/05; H01L 23/5368; H01L 51/50; H01L 51/52
(Continued)

(56) References Cited

U.S. PATENT DOCUMENTS 5,829,128 A * 11/1998 Eldridge ..... H01L 24/72 228/180.21
6,002,163 A 12/1999 Wojnarowski
(Continued)

FOREIGN PATENT DOCUMENTS

CN 1565055 A 1/2005
CN 102593035 A 7/2012
(Continued)

OTHER PUBLICATIONS

Office Action issued in connection with corresponding TW Application No. 104115088 dated Jun. 13, 2018 (English Translation not available).

(Continued)

*Primary Examiner* — Tuan H. Nguyen
(74) *Attorney, Agent, or Firm* — Ziolkowski Patent Solutions Group, SC

(57) ABSTRACT

An electronic packaging assembly having a semiconductor integrated circuit and a plurality of interconnect components is provided. The plurality of interconnect components is operatively coupled to the semiconductor integrated circuit. Further, one or more interconnect components include one or more support elements having a first surface and a second surface, and one or more spring elements having a first end and a second end, and wherein first ends of the one or more spring elements are coupled to the first surface or the second surface of a respective support element.

25 Claims, 7 Drawing Sheets

(51) Int. Cl.

| | |
|---|---|
| ***H01L 25/00*** | (2006.01) |
| ***H01L 33/62*** | (2010.01) |
| ***H01L 33/64*** | (2010.01) |
| ***H01L 33/54*** | (2010.01) |
| ***H01S 5/022*** | (2006.01) |
| ***H01S 5/024*** | (2006.01) |
| ***H01L 23/538*** | (2006.01) |

(52) U.S. Cl.
CPC ..... *H01L 33/54* (2013.01); *H01L 33/62* (2013.01); *H01L 33/647* (2013.01); *H01S 5/02248* (2013.01); *H01S 5/02256* (2013.01); *H01S 5/02476* (2013.01); *H01L 2933/0033* (2013.01); *H01L 2933/0066* (2013.01)

(58) Field of Classification Search
USPC ..... 257/734, 782
See application file for complete search history.

(56) References Cited

U.S. PATENT DOCUMENTS 6,246,247 B1 * 6/2001 Eldridge ..... B23K 20/004 257/E21.503
6,441,315 B1 * 8/2002 Eldridge ..... G01R 1/06711 174/260
6,491,968 B1 * 12/2002 Mathieu ..... G01R 1/06727 156/750
6,672,875 B1 * 1/2004 Mathieu ..... G01R 1/06727 257/E23.078
6,741,085 B1 * 5/2004 Khandros ..... H23K 1/0016 257/E21.503
8,384,203 B2 2/2013 Toh et al.
8,405,996 B2 3/2013 Shaddock et al. ..... B82Y 30/00 165/185
8,955,215 B2 * 2/2015 Rathburn ..... H01R 12/7082 174/254
2001/0012739 A1 * 8/2001 Grube ..... G01R 1/06727 439/862
2001/0020546 A1 * 9/2001 Eldridge ..... B23K 20/004 174/261
2003/0063450 A1 * 4/2003 Miller ..... H01L 23/13 361/783
2004/0046248 A1 3/2004 Waelti et al.
2004/0152348 A1 * 8/2004 Pedersen ..... B23K 1/0016 439/70
2005/0124181 A1 * 6/2005 Brown ..... H01L 24/72 439/66
2006/0186540 A1 * 8/2006 Buchwalter ..... H01L 21/4853 257/737
2007/0152024 A1 7/2007 Pang et al.
2007/0247175 A1 * 10/2007 Khandros ..... G01R 1/06727 324/754.07
2007/0273018 A1 * 11/2007 Onozuka ..... B81C 1/0023 257/690
2008/0100323 A1 * 5/2008 Mayder ..... G01R 1/07378 324/754.18
2010/0032096 A1 * 2/2010 Yu ..... H01L 21/67103 156/345.52
2010/0328896 A1 12/2010 Shaddock et al.
2011/0084383 A1 4/2011 Mizutani
2012/0068319 A1 3/2012 Choi et al.
2013/0021669 A1 1/2013 Xi et al.
2013/0062775 A1 3/2013 Ryan
2013/0105993 A1 * 5/2013 Bahadur ..... H01L 24/11 257/782
2014/0124940 A1 * 5/2014 Bhagavat ..... H01L 23/147 257/773
2014/0261608 A1 * 9/2014 Wang ..... H01L 35/32 136/224

FOREIGN PATENT DOCUMENTS

| | | | |
|---|---|---|---|
| EP | 2270852 | A2 | 1/2011 |
| EP | 2466643 | A2 | 6/2012 |
| JP | 2007531243 | A | 11/2007 |
| JP | 2008135428 | A | 6/2008 |
| JP | 2010219397 | A | 9/2010 |
| JP | 2013065761 | A | 4/2013 |
| WO | 2008025004 | A2 | 2/2008 |

OTHER PUBLICATIONS

First Office Action and Search issued in connection with corresponding CN Application No. 201510363890.7 dated Jul. 25, 2018 (English Translation not available).
Second Office Action issued in connection with corresponding CN Application No. 201510363890.7 dated Dec. 20, 2018 (English Translation not available).
Milena Vujosevic, "Thermally induced deformations in die-substrate assembly", Theoret. Appl. Mech, pp. 305-322, vol. 35, Issue 1-3, 2008.

* cited by examiner

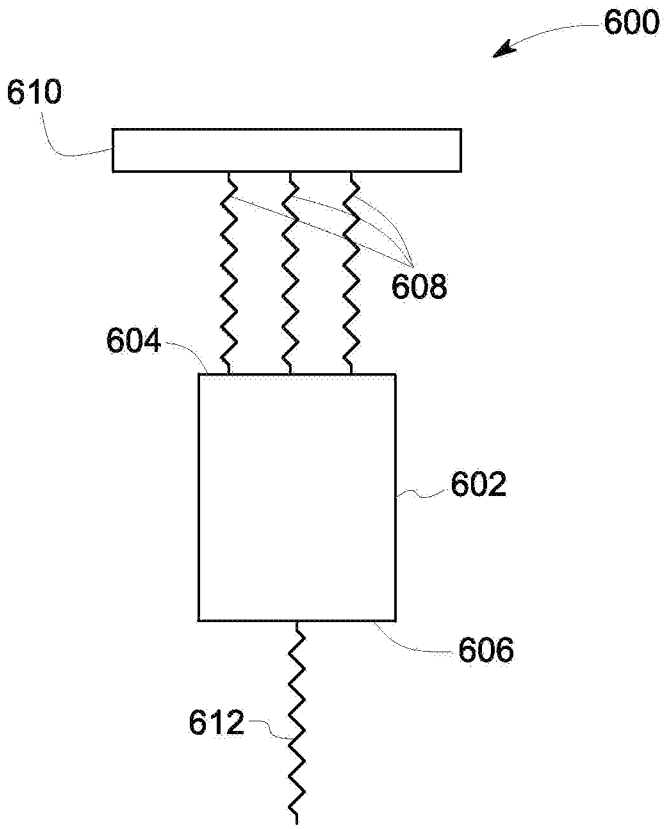
FIG. 6
AMENDED

INTERCONNECT DEVICES FOR ELECTRONIC PACKAGING ASSEMBLIES

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

BACKGROUND

Embodiments of the present specification relate to interconnects, and more particularly to interconnects for semiconductor devices.

Commercially available semiconductor devices employ a variety of different interconnect technologies. For example, leaded semiconductor devices feature lead plates having a series of leads or pins. For connecting the semiconductor devices to a printed circuit board (PCB) the leads are pressed into the PCB and soldered.

Further, flip chip semiconductor devices employ solder bumps and/or copper pillars for connection to an external article such as a semiconductor device or a printed circuit board. As will be appreciated, a semiconductor integrated circuit of a semiconductor device includes a series of pads on one or more surfaces. Typically, solder bumps are formed on the series of pads and subsequently, the integrated circuit is flipped to interface with the external article. With solder bumps interfaced to the external article, the solder bumps are re-melted to form an electrical connection with the external article. In addition, a mounted semiconductor integrated circuit may be subject to under-filling to dispose underfill material between an underside of the semiconductor integrated circuit and the external article. The underfill material may include an electrically insulated adhesive.

BRIEF DESCRIPTION

In accordance with aspects of the present specification, an electronic packaging assembly having a semiconductor integrated circuit and a plurality of interconnect components is provided. The plurality of interconnect components is operatively coupled to the semiconductor integrated circuit. Further, one or more interconnect components include one or more support elements having a first surface and a second surface, and one or more spring elements having a first end and a second end, and wherein first ends of the one or more spring elements are coupled to the first surface or the second surface of a respective support element.

In accordance with another aspect of the present specification, an electronic packaging assembly having a semiconductor device, an interconnect device operatively coupled to the semiconductor device, and an external article operatively coupled to the interconnect device such that a plurality of interconnect components of the interconnect device extend between the semiconductor device and the external article. Further, one or more interconnect components of the plurality of interconnect components include a plurality of support elements, where each support element of the plurality of support elements include a first surface and a second surface. Further, the one or more interconnect components include a plurality of spring elements, where each spring element of the plurality of spring elements include a first end and a second end, and where one or more spring elements are coupled to the first surface or the second surface of a respective support element at the first end.

In accordance with yet another aspect of the present specification, a method for making an electronic packaging assembly is provided. The method includes providing a semiconductor device having an interface layer, providing an interconnect device having a plurality of interconnect components, and coupling at least a portion of the interconnect device to the interface layer of the semiconductor device. Further, the interconnect device includes a plurality of support elements, where each support element of the plurality of support elements comprises a first surface and a second surface, and a plurality of spring elements. Moreover, each spring element of the plurality of spring elements includes a first end and a second end. Also, one or more spring elements are coupled to the first surface or the second surface of a respective support element at the first end.

DRAWINGS

These and other features, aspects, and advantages of the present disclosure will become better understood when the following detailed description is read with reference to the accompanying drawings in which like characters represent like parts throughout the drawings, wherein:

FIG. 6 is a schematic representation of an exemplary interconnect component having a support element, a plurality of spring elements and a cap.

DETAILED DESCRIPTION

Figure 1:
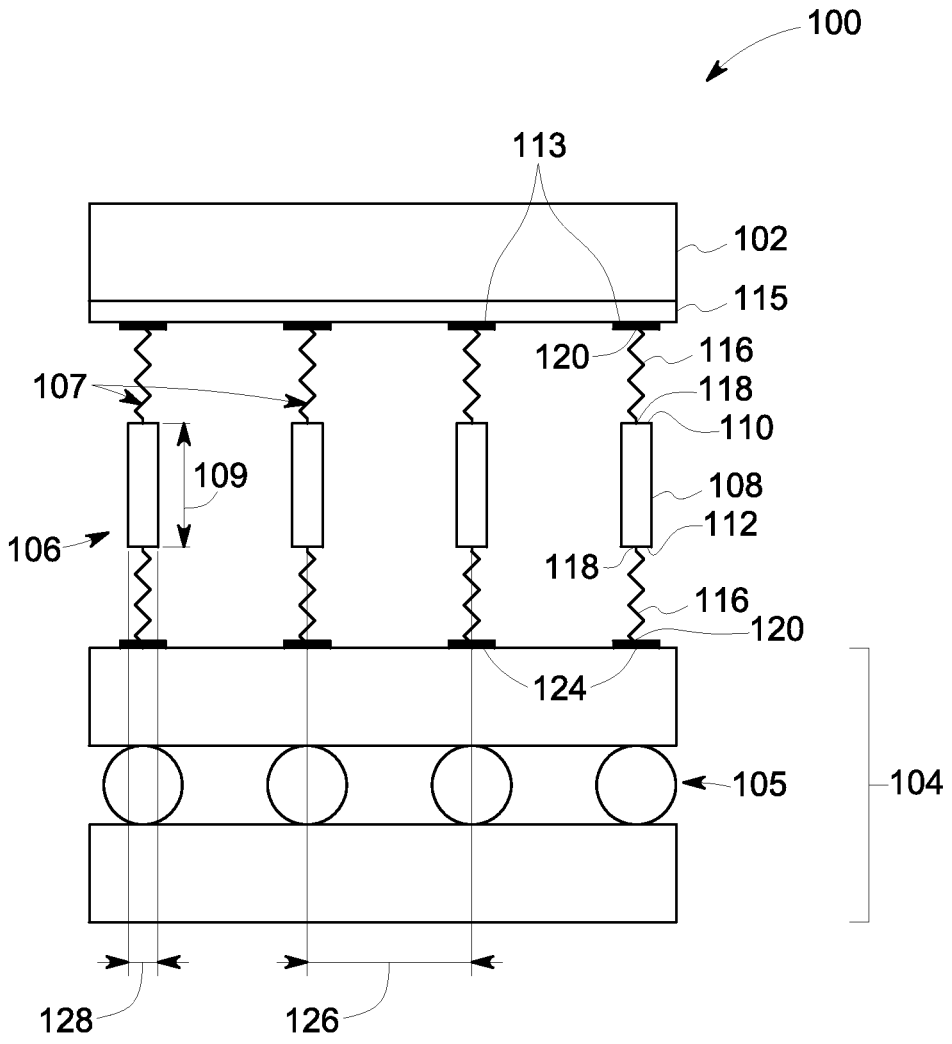
FIG. 1 is a schematic representation of an electronic packaging assembly employing an interconnect device having a plurality of interconnect components, in accordance with embodiments of the present specification.

Embodiments of the present specification relate to interconnect devices for electronic packaging assemblies. In some embodiments of the present specification, the interconnect devices may be configured to operatively couple a semiconductor device and an external article. In operation, the interconnect devices may be configured to provide electrical and/or thermal connection between the semiconductor device and the external article. In certain embodiments, the interconnect devices may be configured to provide connection between two silicon dies, or a silicon die and an organic substrate, or a silicon die and an inorganic substrate.

Further, in some embodiments, the interconnect devices may be configured to facilitate reduced or zero warpage of the semiconductor device and/or the external article. As used herein, the term "warpage" entails physical deforming in a device caused by internal stresses within that device. Non-limiting example of such internal stresses may include thermal stresses and/or mechanical stresses. In one embodiment, the interconnect devices may be configured to tolerate stresses generated in the electronic packaging assembly. Further, the interconnect devices may be configured to at least partly prevent occurrence of warpage in the semiconductor device and/or the external article.

In certain embodiments, the semiconductor device may include a microprocessor, a microprocessor integrated circuit, a semiconductor integrated circuit, a laser, a light emitting diode (LED), or combinations thereof. Further, the semiconductor integrated circuit may include a two-dimensional (2D) packaging configuration or a three-dimensional (3D) packaging configuration. Non-limiting examples of the semiconductor integrated circuits may include a flip chip, a multi-chip module, a 2.5 stacked die package, a 3D stacked die package, or combinations thereof.

It may be noted that typically in an electronic packaging assembly, a reflow process is used to operatively couple a die of the semiconductor device and a die of the external article or any other substrate. Generally, during the reflow process internal stresses may be generated within the electronic packaging assembly. By way of example, these internal stresses may be generated due to thermal mismatch between materials of different components of the electronic packaging assembly. Non-limiting examples of the different components may include dies of the semiconductor device, bumps or ball grid arrays of the integrated circuit, and a die or a substrate of the external article. Electronic packaging assemblies employing conventional interconnects may experience a build-up of internal stresses. For example, the conventional interconnects may not be configured to suitably address a thermal mismatch between materials of the different components of the electronic packaging assemblies. As a result there may be an occurrence of warpage in the resultant electronic packaging assembly during or after the reflow process. Further, if not controlled, the warpage may result in cracks in the electronic packaging assembly. By way of example, the warpage may be caused in the substrate of the semiconductor device interconnect device, the die, the substrate, or combinations thereof.

In certain embodiments, the interconnect device may be configured to compensate for at least a portion of a thermal mismatch between the semiconductor device and the external article during the reflow process. Accordingly, the electronic packaging assembly employing the interconnect device may experience minimal or zero internal stresses, thereby at least in part addressing the warpage issue. In certain embodiments, the interconnect device may be configured to distribute loads attributable to thermal expansion resulting from self-heating of the semiconductor device or the integrated circuit. In some instances, such loads may occur due to the presence of hot spots and/or cold spots in the electronic packaging assembly. As used herein, the term "hot spots" refers to one or more areas of the semiconductor device and/or the external article of the electronic packaging assembly that have relatively high thermal energy relative to other areas of the semiconductor device and/or the external article. Further, as used herein, the term "cold spots" refers to one or more areas of the semiconductor device and/or the external article of the electronic packaging assembly that have relatively low thermal energy relative to other areas of the semiconductor device and/or the external article. The hot spots and the cold spots inducing circuitries may be present in a variety of integrated circuit applications, such as, but not limited to, microprocessor integrated circuitry for power delivery applications, integrated circuit interface for microcontroller applications, memory applications, or combinations thereof. By way of example, the hot spots may be present in processor cores, and the cold spots may be present in processor cache, for example in microprocessor applications.

In certain embodiments, the interconnect device of the present specification is configured to provide a desirable amount of flexibility to the electronic packaging assembly to minimize or eliminate occurrence of warpage that may otherwise be caused due to the internal stresses in the electronic packaging assembly. Further, the interconnect device may be configured to prevent occurrence of cracks in the electronic packaging assembly by enhancing the flexibility of the electronic packaging assembly.

In some embodiments, the interconnect device may include a plurality of interconnect components. Further, one or more interconnect components may include a combination of one or more support elements and one or more spring elements. In certain embodiments, a support element may have a first surface and a second surface, and the spring elements may have a first end and a second end. Additionally, one or more spring elements may be disposed on the first surface, the second surface, or both the first and second surfaces of the support element. Further, the spring elements may be coupled to the support elements at the first ends, whereas, the second ends also referred to as "distal ends" of the spring elements may be coupled to another support element, the substrate of the semiconductor device, or the external article. As used herein, the term "ends" may be used to refer to at least a portion of an end surface of the spring element, or one or more of a curved, a coiled, or kinked portion adjacent the first or second end of the spring elements. In one embodiment, one or more interface layers may be disposed between the interconnect device and the semiconductor device, and/or the interconnect device and the external article. The interface layers may be configured to facilitate coupling and/or thermal management in the electronic packaging assembly.

In some embodiments, various support elements of an interconnect device may be same or different. In one example, materials, dimensions and/or shape of a support element may be determined based on thermal and electrical requirements of the electronic packaging assembly. Further, in certain embodiments, various spring elements of the interconnect device may be same or different. In one embodiment, the various spring elements may have same or different spring constants. By way of example, the spring constants of the spring elements disposed in and around the hot spots, or the regions with relatively high thermal energy, may be comparatively larger than the spring constants of the spring elements disposed closer to the spots, or the regions with comparatively low thermal energy.

FIG. 1 illustrates an electronic packaging assembly 100 having a semiconductor device 102, an external article 104, and an interconnect device 106. The interconnect device 106 is disposed between the semiconductor device 102 and the external article 104. In the illustrated embodiment, the external article 104 includes a ball grid array 105. Further, in one embodiment, the external article 104 may be a part of an integrated circuit apparatus. Non-limiting examples of the external article 104 may include a printed circuit board, an integrated circuit, such as a flip chip.

In one embodiment, one or more interface layers 115 may be disposed between the interconnect device 106 and the semiconductor device 102, and/or the interconnect device 106 and the external article 104. The one or more interface layers 115 may be configured to facilitate coupling between the interconnect device 106 and the semiconductor device 102 and/or the external article 104. Further, the one or more interface layers 115 may be configured to facilitate thermal and/or electrical conductivity of the interconnect device 106 to the semiconductor device 102, the external article 104, or both. In a non-limiting example, the interface layer 115 may be in the form of a layer that is configured to facilitate coupling, thermal conductivity, electrical conductivity, or combinations thereof between adjacently disposed devices, such as the semiconductor device 102 and the interconnect device 106. In alternative embodiments, the interface layer may be in the form of a plurality of independent portions that are physically disconnected from one another.

Additionally, in some embodiments, the interconnect device 106 includes a plurality of interconnect components 107. In one embodiment, all the plurality of interconnect components 107 may be similar to one another. Alternatively, in another embodiment, one or more interconnect components 107 of the plurality of interconnect components 107 may be different from other interconnect components 107. In one embodiment, a structure of an individual interconnect component 107 may be selected based on thermal energy requirements, mechanical requirements, or the like of a respective location in the electronic packaging assembly where a given interconnect component 107 is being employed. In the illustrated embodiment, the plurality of interconnect components 107 include support elements 108 having a first surface 110 and a second surface 112.

Moreover, the interconnect device 106 includes a plurality of spring elements 116, where each spring element 116 includes a first end 118 and a second end, also referred as a "distal end" 120. Further, the first ends 118 of one or more spring elements 116 may be coupled to the first surface 110 or the second surface 112 of a respective support element 108.

Further, the first surface 110 and/or the second surface 112 of the support elements 108 may include one or more coupling layers (not shown in FIG. 1) to facilitate coupling of the spring elements 116 to the support elements 108, or coupling of the support elements 108 to other surfaces, such as, but not limited to surfaces of the semiconductor device 102, or the external article 104. Alternatively, the first and/or second ends 118 and 120 of the spring elements 116 may include the coupling layers. In one example, the coupling layer of the spring elements 116 may be in the form of a layer or a curved structure, such as a cap. Further, the coupling layer may include aluminum, copper, silver, platinum, silicon, silica, alumina, aluminum nitride, or combinations thereof. In one embodiment, a thickness of the one or more coupling layers may be less than about 1 mm. In another embodiment, the thickness of the one or more coupling layers may be less than about 30 microns.

In certain embodiments, the support elements 108 may include a pillar structure, a tubular structure, a columnar structure, a cylindrical structure, a bump, a cube, a cuboid, or combinations thereof. Further, in one embodiment, a diameter 128 of the support element 108 is about 50% of a pitch of the interconnect device. Furthermore, the diameter 128 of the support element 108 may be in a range from about 10 microns to about 60 microns. In another embodiment, the diameter 128 of the support elements 108 may be in a range from about 20 microns to about 40 microns. In some embodiments, the plurality of support elements 108 and/or the plurality of spring elements 116 may be manufactured to have relatively smaller diameters than bumps that are typically used in conventional interconnect devices. Moreover, the support elements 108 may be made of an electrically and thermally conductive material, such as, but not limited to, aluminum, copper, silver, platinum, or combinations thereof. In a non-limiting example, the one or more interface layers 115 may be made of an electrically and thermally conductive adhesive material, such as silver epoxy adhesive. Further, the one or more interface layers 115 may include an alloy of copper, aluminum, silver, gold, platinum, tungsten, silicon, zinc oxide, silicon nitride, titanium, or any combinations of these materials. In one embodiment, the one or more interface layers 115 may have similar thermal conductivity and bonding characteristics as adjoining structures.

Further, in certain embodiments, the spring elements 116 may include helical springs, nano-springs, kinked structures, or combinations thereof. As used herein, the term "nano-springs" refers to a structure having at least one dimension that measures less than about 10 microns and that has an initial shape that is compliant under an applied load and returns to substantially the initial shape upon removal of the load. As used herein, the term "substantially" is accommodative of up to about 5% deviation in the initial shape of the nano-springs. Further, the term "compliant" refers to the quality of having a reversible deformation in a load-unload cycle. Moreover, "reversible deformation" entails an elastic deformation in the range of about 1% to 1000% of coefficient of thermal expansion (CTE) mismatch of the semiconductor device 102 and external article 104.

In some embodiments, the spring elements 116 may be made of electrically and thermally conductive materials, such as, but not limited to, a metal, a metal alloy, a ceramic, or a composite material. In one embodiment, the spring elements 116 may be made of copper, aluminum, silver, gold, platinum, tungsten, silicon, zinc oxide, silicon nitride, titanium, molybdenum, tantalum, or any combinations of these materials. In one embodiment, one or more spring elements 116 may have a thermal conductivity of greater than about 1 watt/mK. In one embodiment, one or more spring elements 116 may have a thermal conductivity of greater than about 10 watt/mK. In one embodiment, one or more spring elements 116 may have a thermal conductivity of greater than about 100 watt/mK. Further, one or more spring elements 116 may have a thermal conductivity that is different from the thermal conductivity of the other spring elements 116.

In one embodiment, an average diameter of the spring elements 116 may be less than about 2 micrometers. As used herein, the term "diameter" is indicative of the cross-sectional width of the spring elements 116. The "cross sectional width" refers to the largest dimension in a cross section of the spring elements 116 in a direction perpendicular to a length of the spring elements 116 at any given point of the spring elements 116. For example, if a spring element 116 having a given length is of a regular rectangular shape all throughout the length of the spring element 116, the cross sectional width is the diagonal length of the rectangle in a direction perpendicular to the length of the spring element 116. In an example with cylindrical spring elements 116 of different diameters through the length, the cross sectional width is the largest diameter of the spring elements 116 in a direction perpendicular to the length of the spring elements 116. In a further embodiment, the median spring diameter of the plurality of spring elements 116 is in a range from about 10 nm to about 2 microns. In a specific embodiment, the plurality of spring elements 116 has a median spring cross sectional width in a range from about 100 nm to about 1 microns.

In certain embodiments, the interconnect device 106 may be bonded to the semiconductor device 102 and/or the external article 104 through metallic bonding. In one specific embodiment, the interconnect device 106 is bonded to the semiconductor device 102 and/or the external article 104 through soldering. A variety of low temperature melting and high thermal conductivity materials may be used for soldering. One non-limiting example of such a material is indium and low melting alloys of indium. In one embodiment, the bonding force between the interconnect device 106 and adjacent surface is in a range from about 10 $N/cm^2$ to about 400 $N/m^2$.

In the illustrated embodiment, each of the interconnect components 107 is coupled to a respective pad 113 of the interface layer 115 of the semiconductor device 102 and a respective pad 124 of the external article 104. In particular, the second or distal ends 120 of the one or more spring elements 116 are coupled to the pads 113 of the semiconductor device 102 or the pads 124 of the external article 104. Further, in some embodiments, a pattern of the pads 113 and 124 may match a pattern of the interconnect components 107. The pads 113 and 124 may be made of thermally conductive material, such as, but not limited to, aluminum, copper, gold, silver, or combinations thereof. Further, the material of the pads 113 and 124 may be selected so as to facilitate coupling of the semiconductor device 102 and/or the external article and the interconnect components 107. In particular, the material of the pads 113 and 124 may be selected to facilitate coupling of the distal ends 120 of the spring elements 116 to the pads 113 and 124.

In certain embodiments, a pitch 126 of the interconnect device 106 may be defined as a gap between two adjacently disposed interconnect components 107. In particular, the pitch 126 may be defined as a gap between center lines of two adjacently disposed support elements 108 of respective interconnect components 107. In one embodiment, the pitch 126 may be in a range from about 20 microns to about 100 microns. In another embodiment, the pitch 126 may be in a range from about 30 microns to about 40 microns. The pitch 126 may be tuned to accommodate internal stresses that may be present in the electronic packaging assembly 100 to at least partially prevent warpage in the electronic packaging assembly 100. As the value of the pitch 126 decreases, that is, as the distance between any two adjacently disposed interconnect components 107 decreases, the thermal conductivity of the interconnect device 106 increases. Further, in some embodiments, the pitch 126 may be decided based on the desirable interconnect density. The interconnect density in turn may be decided based on an amount of flexibility required by the electronic packaging assembly 100. In instances where the system has a higher amount of internal stresses, the pitch 126 may be modified to allow suitable amount of flexibility by the interconnect device 106. In some embodiments, the interconnect components 107 may have uniform pitch. However, in some other embodiments, the value of the pitch 126 may vary for different interconnect components 107. In these embodiments, the pitch 126 may be defined as an average distance between two adjacently disposed interconnect components 107. Moreover, although not illustrated in FIG. 1, in some embodiments, an underfill material may be disposed between one or more interconnect components 107 to further enhance the mechanical strength of the electronic packaging assembly 100. In certain embodiments, the pitch 126 may be suitable to facilitate the reflow process, and/or allow the underfill material to be disposed between the interconnect components 107 of the interconnect device 106.

In general, as the number of the interconnect components 107 with physical contact with a surface in a particular area increases, the thermal conductivity between the interconnect components 107 and the surface also increases. In one embodiment, the interconnect device 106 may include at least 50 interconnect components 107 in 1 cm2 of area. In a further embodiment, the interconnect device 106 may include at least 100 interconnect components 107 in 1 cm2 of area.

In certain embodiments, advantageously, the interconnect device [100] *106* is configured to accommodate at least in part stresses attributable to mismatched thermal expansion of the semiconductor device 102 with respect to the external article 104 that may result from self-heating of the semiconductor device 102. In some embodiments, another advantage of the interconnect device 106 of the present specification may include avoiding use of the underfill. As will be appreciated, typically, the underfill may be provided for distribution of loading attributable to the thermal expansion resulting from the self-heating of the semiconductor device 102 may be avoided when the interconnect device [102] *106* is configured to accommodate thermal expansion between the semiconductor device 102 and the external article 104.

Moreover, because use of the underfill may be avoided, material cost of the electronic packaging assembly 100 may be reduced relative to a conventional assembly that uses the underfill. Still further, manufacturing problems associated with providing the underfill may be avoided. In some embodiments, where smaller pitch dimensions may be used for the plurality of support elements 108 and/or the plurality of spring elements 116, processing time required to provide the underfill between the plurality support elements 108 and/or the plurality of spring elements 116. By way of example, the underfill within the plurality of using a vacuum underfill process or jet dispensed underfill processes in excess of thirty minutes or hours have been observed. Still further, as use of the underfill may be avoided in the electronic packaging assembly 100, a spacing distance between the plurality of support elements 108 and/or the plurality of spring elements 116 may be reduced.

Figure 2:
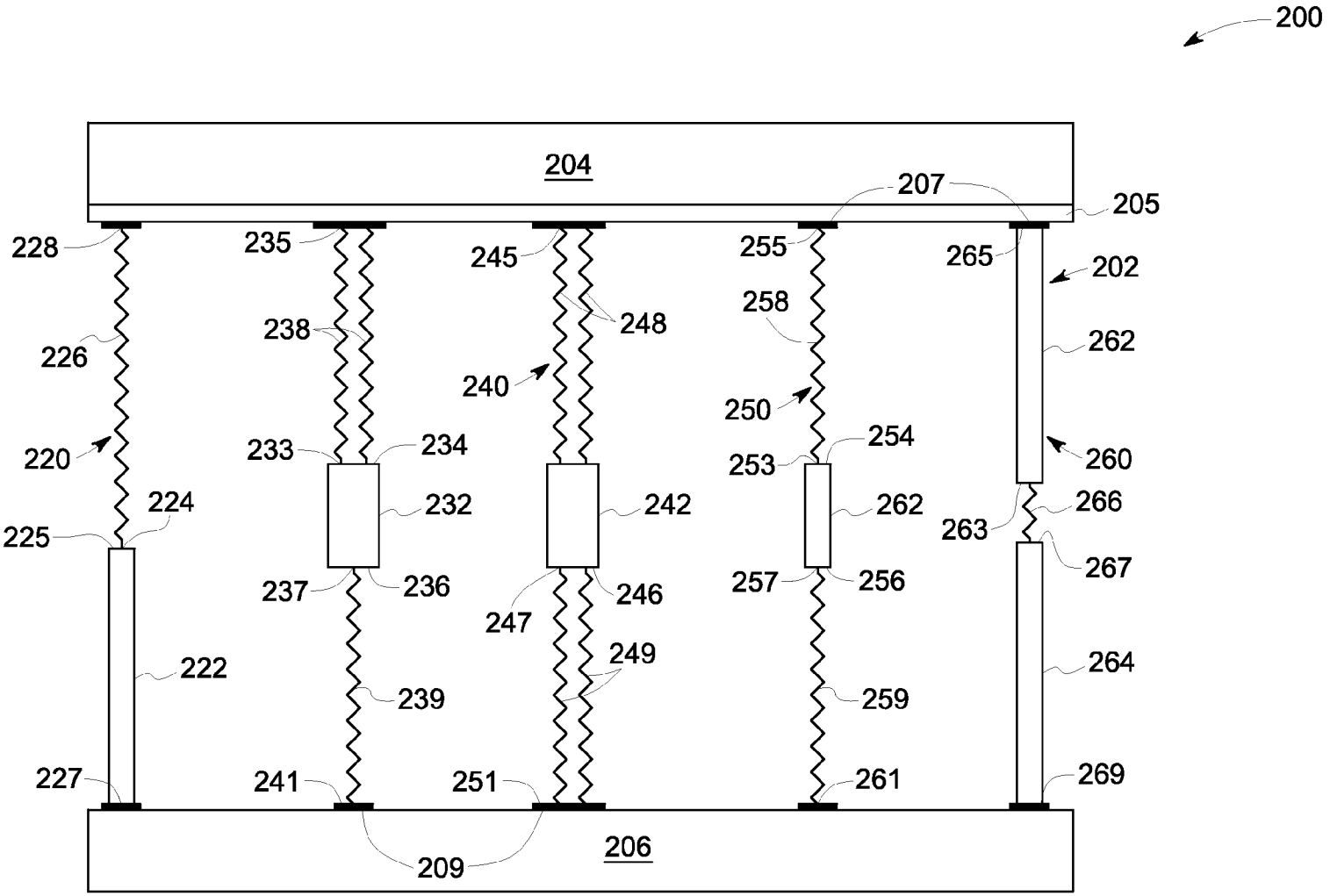
FIG. 2 is a schematic representation of an exemplary electronic packaging assembly employing an interconnect device having a plurality of interconnect components having different structural designs, in accordance with embodiments of the present specification.

FIG. 2 illustrates another embodiment of an electronic packaging assembly of the present specification. In the illustrated embodiment, the electronic packaging assembly 200 includes an interconnect device 202 operatively coupled to a semiconductor device 204 and an external article 206. The semiconductor device 204 includes an interface layer 205 having a plurality of pads 207. In the illustrated embodiment, the interconnect device 202 includes a plurality of interconnect components 220, 230, 240, 250, and 260 each having different structural design. The structural designs of the interconnect components 220, 230, 240, 250, and 260 may be chosen based on thermal management requirements, load requirements, internal stresses, and the like in the electronic packaging assembly. In the illustrated embodiment, each interconnect component includes one or more support elements and one or more spring elements. In particular, the interconnect component 220 includes a support element 222 having a first surface 225 and a second surface 227. Further, the interconnect component 220 includes a spring element 226 having a first end 224 and a second end 228. The first surface 225 of the support element 222 is coupled to the first end 224 of the spring element 226. Whereas, the second surface [224] *227* of the support element 222 is coupled to the external article 206 using pads 209. Further, the distal end 228 of the spring element 226 is coupled to the semiconductor device 204 via the pads 207.

Moreover, the interconnect component 230 of the interconnect device 202 includes a support element 232 having a first surface 234 and a second surface 236. Further, the interconnect component 230 includes two spring elements 238 having first ends 233 and second ends 235. Moreover, the interconnect component 230 includes a spring element 239 having a first end 237 and a second end 241. The first ends 233 of the spring elements 238 are disposed on the first surface 234 of the support element 232, and the second ends 235 are coupled to the pads 207. Further, the first end 237 of the spring element 239 is disposed on the second surface 236 of the support element 232 and the second end 241 is coupled to the pads 209. The spring elements 238 and 239 may be same or different in structure, dimensions and/or properties.

Further, the interconnect component 240 of the interconnect device 202 includes a support element 242 having a first surface 244 and a second surface 246. Further, the interconnect components 240 includes two spring elements 248 having first ends 243 and second ends 245, and another two spring elements 249 having first ends 247 and *second ends* 251. The first ends 243 of the spring elements 248 are disposed on the first surface 244 of the support element 242, and the second ends 245 of the spring elements 248 are coupled to the pads 207. Further, the first ends 247 of the spring elements 249 are coupled to the second surface 246 of the support element 242, and the second ends [251] *245* of the spring elements 249 are coupled to the pads 209.

In addition, the interconnect component 250 includes a support element 252 having a first surface 254 and a second surface 256. Further, the first and second surfaces 254 and 256 are each coupled to spring elements 258 and 259. The first ends 253 and 257 of the spring elements 258 and 259 are disposed on the first and second surfaces 254 and 256 of the support element 252. Further, the distal ends 255 and 261 are coupled to the pads 207 and 209, respectively.

Moreover, the interconnect component 260 includes a support element 262 having a first surface 263 and a second surface 265. Further, the interconnect component 260 includes another support element 264 having a first surface 267 and a second surface 269. The first surfaces 263 and 267 of the support elements 262 and 264 are coupled to one another by a spring element 266. Further, the second surfaces 265 and 269 of the support elements 262 and 264 are coupled to the pads 207 and 209, respectively.

It may be noted that the structural designs of each of the interconnect components 220, 230, 240, 250, and 260 may be used in combination with each other in an electronic packaging assembly. For example, a given electronic packaging assembly may employ a combination of the interconnect components 230 and 240. Alternatively, two or more of a single type of the interconnect components 220, 230, 240, 250, and 260 may be used in the electronic packaging assembly. For example, a given electronic packaging assembly may have a plurality of interconnect components 230 as an interconnect device. Further, the individual interconnect components 220, 230, 240, 250, or 260 may be used in combination with conventional interconnect devices. Also, several other variations of the interconnect components 220, 230, 240, 250, and 260 may be envisioned. By way of example, in one embodiment, a first surface of a given support element may be coupled to two or more spring elements, whereas, a second surface of the given support element may be coupled to an external article.

Figure 3:
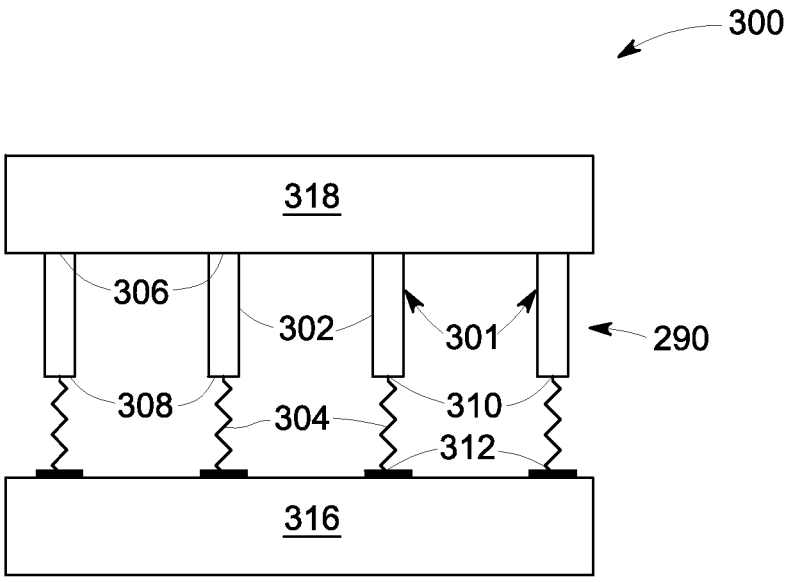
FIG. 3 is a schematic representation of an exemplary electronic packaging assembly employing an interconnect device, where the interconnect device includes a plurality of interconnect components having a spring element disposed on a first [surfaces] *surface* of each support element of the plurality of support elements, in accordance with embodiments of the present specification.

FIG. 3 illustrates an example of a variation of the interconnect components 220, 230, 240, 250, and 260 of FIG. 2. In the illustrated embodiment, an electronic packaging assembly 300 includes an interconnect device 290 having a plurality of interconnect components 301. Further, one or more interconnect components 301 of the plurality of interconnect components 301 may include one or more support elements 302 and one or more spring elements 304. Each support element 302 includes a first surface 306 and a second surface 308. Further, the spring elements 304 include a first end 310 and a second end 312. In the illustrated embodiment, the first ends 310 of the spring elements 304 are coupled to the second surface 308 of the support elements 302. The second or distal ends 312 of the spring elements 304 may be configured to be coupled to an external article 316. Further, the first surface 306 of the support elements 302 may be configured to be coupled to a semiconductor device 318. In a non-limiting example, the semiconductor device 318 may be a LED.

Figure 4:
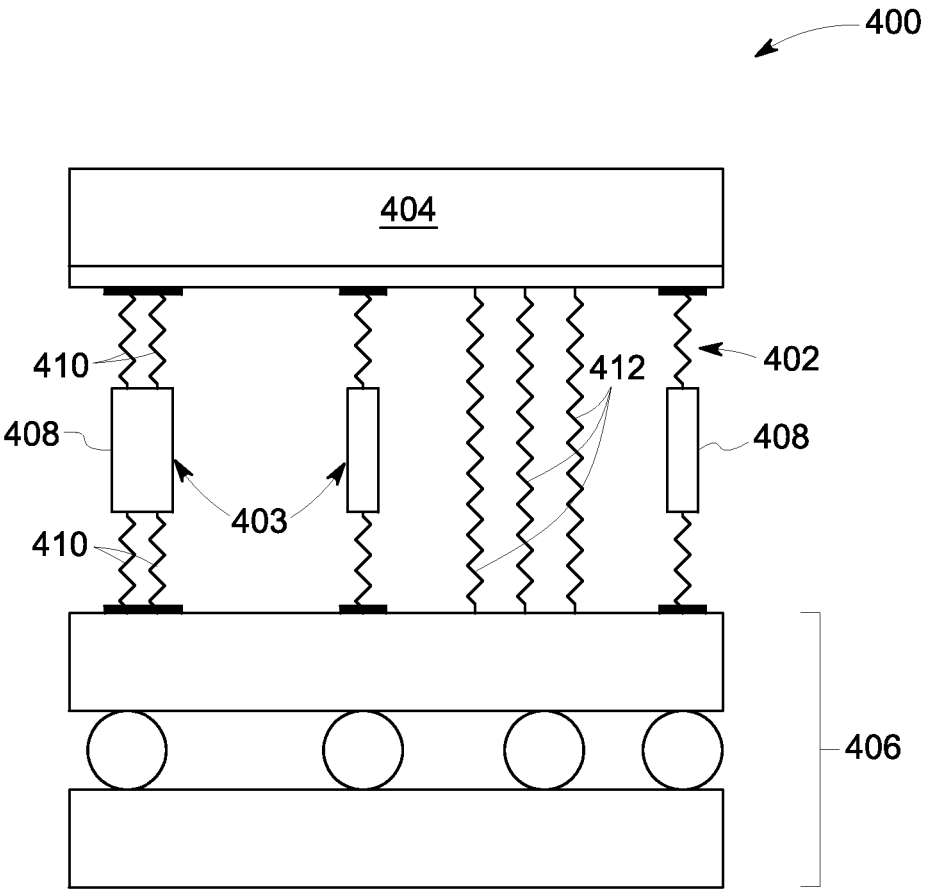
FIG. 4 is a schematic representation of an exemplary electronic packaging assembly employing an interconnect device, where the interconnect device includes interconnect components having a plurality of support elements and a plurality of spring elements, and where the interconnect device also includes other spring elements, in accordance with embodiments of the present specification.

FIG. 4 illustrates yet another embodiment of an electronic packaging assembly of the present specification. In the illustrated embodiment, the electronic packaging assembly 400 includes an interconnect device 402 disposed between a semiconductor device 404 and an external article 406 to thermally and electrically connect the semiconductor device 404 and the external article 406.

As illustrated, the interconnect device 402 includes a plurality of interconnect components 403. Further one or more interconnect components 403 of the plurality of interconnect components 403 may include one or more support elements 408 and one or more spring elements 410. Moreover, one or more spring elements 410 may be operatively coupled to a support element 408. Further, in the illustrated embodiment, the interconnect device 402 may also include other plurality of spring elements 412. The other spring elements 412 may be disposed as a set as illustrated. Alternatively, the other spring elements 412 may be dispersed intermittently between the support elements 408. The other spring elements 412 may be configured to provide enhanced tolerance or flexibility to the interconnect device 402. Alternatively, the bumps, micro-bumps, underfill material may be used in place of or in combination with other spring elements 412.

Figure 5:
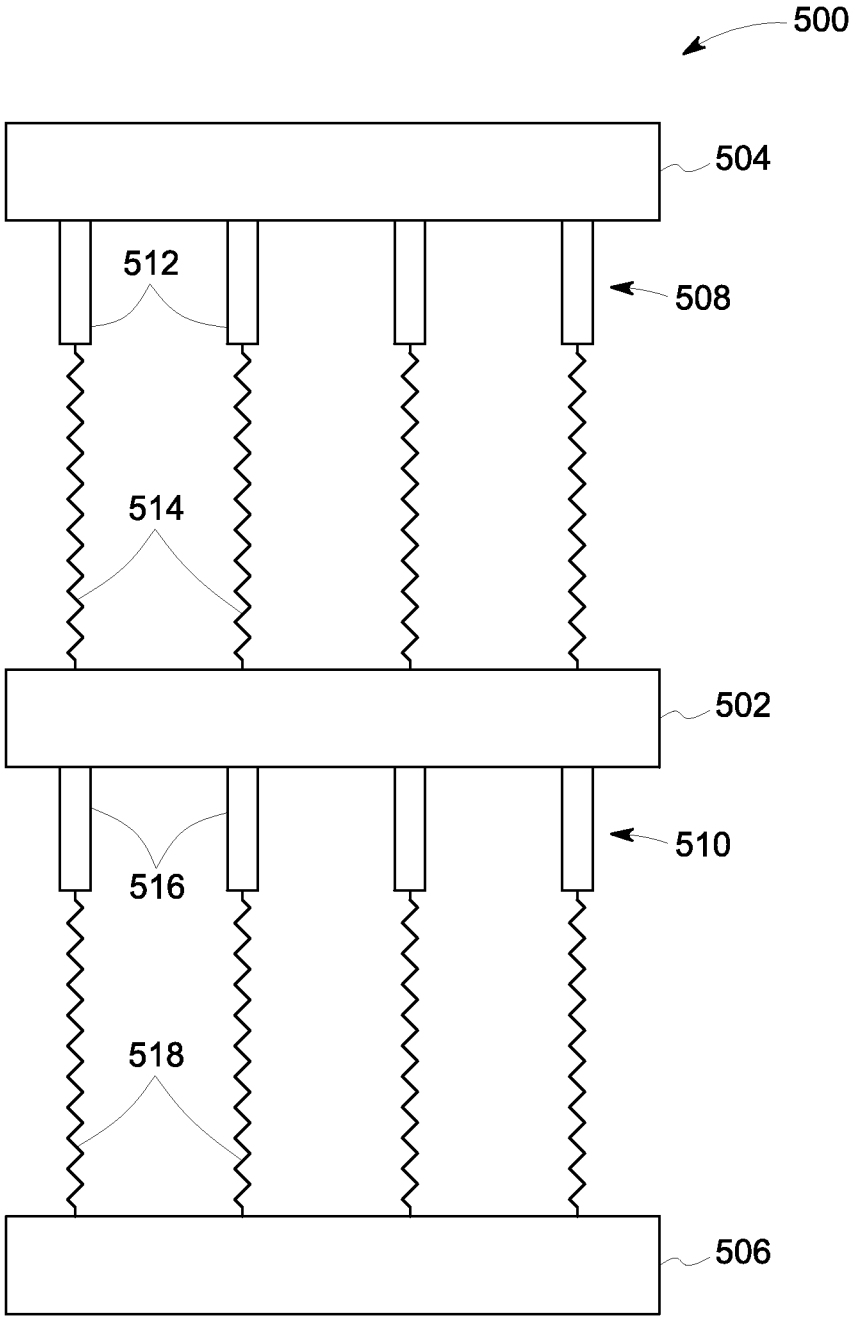
FIG. 5 is a schematic representation of an exemplary electronic packaging assembly having a thermo-electric cooler operatively coupled to a laser and a substrate, in accordance with embodiments of the present specification.

FIG. 5 illustrates an alternate embodiment of an electronic packaging assembly of the present application. In the illustrated embodiment, the electronic packaging assembly 500 includes a thermo-electric cooler 502 operatively coupled to a laser 504 and a substrate 506. In one example, the substrate 506 may be a substrate of an external article, such as a processor. In particular, the thermo-electric cooler 502 is coupled to the laser 504 using an interconnect device 508. Further, the thermo-electric cooler 502 is coupled to the substrate 506 using another interconnect device 510. The interconnect devices 508 and 510 may be similar or different based on thermal management and stress management requirements of the electronic packaging assembly 500. The interconnect device 508 includes a plurality of support elements 512 and a plurality of spring elements 514. Likewise, the interconnect device 510 includes a plurality of support elements 516 and a plurality of spring elements 518.

FIG. 6 illustrates an exemplary interconnect component 600 having a support element 602 having a first surface 604 and a second surface 606. Further, the interconnect component 600 includes a plurality of spring elements 608 coupled to the first surface 604 of the support element 602. The plurality of spring elements 608 are coupled together using a coupling layer or a cap 610. The different spring elements 608 may be similar or different. In the illustrated embodiments, the cap 610 is in the form of a layer, however, other shapes of the cap 610 are also envisioned. By way of example, the cap 610 may have curved surfaces. Further, in the illustrated embodiment, the spring elements 608 may be coupled to the cap 610 at different locations, however, in alternative embodiments, the spring elements 608 may converge and couple to a common location on the cap 610. Advantageously, the cap 610 may be configured to act as a protection layer configured to provide mechanical and chemical protection to the spring elements 608. By way of example, the cap 610 may be configured to [provide] *prevent* undesirable interaction between the materials of the spring elements 608 and adjacent structure, such as a semiconductor device. Additionally, the interconnect component 600 may include a spring element 612 coupled to the second surface 606 of the support element 602. In alternative embodiments, the second surface 606 may include two or more spring elements 612.

Figure 7:
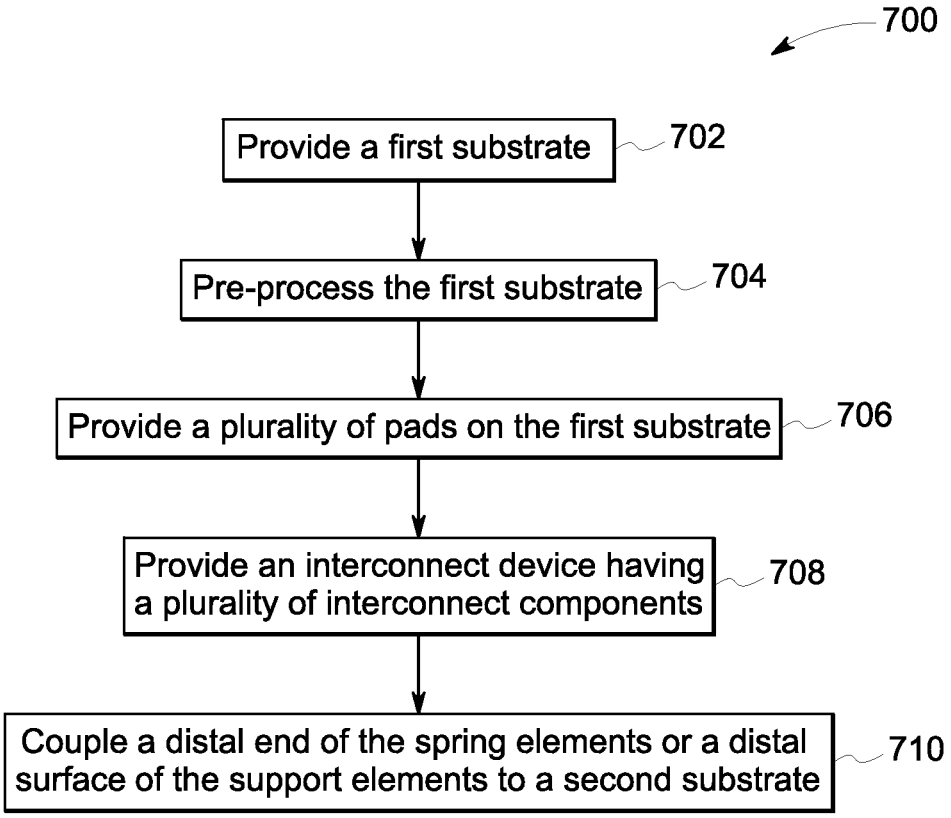
FIG. 7 is an exemplary method for forming an interconnect device, in accordance with embodiments of the present specification.

FIG. 7 illustrates an exemplary method 700 for making interconnect devices of the present specification. At step 702, the method 700 may commence by providing a suitable first substrate. In one example, the first substrate may be a substrate (e.g., a die) of a semiconductor device. In another embodiment, the first substrate may be a substrate of an external article. Further, the first substrate may be made of silicon, copper, glass, semiconductor materials, or combinations thereof. Optionally, at step 704, the first substrate may be pre-processed to clean one or more surfaces of the substrate. By way of example, the substrate may be pre-processed to remove any dirt or grease from the surfaces of the substrate.

Further, at step 706, a plurality of pads corresponding to a plurality of support elements and/or a plurality of spring elements may be provided on the first substrate. Moreover, at step 708, an interconnect device may be formed on the substrate. In particular, the interconnect device may be formed by: (1) forming one or more spring elements of the plurality of spring elements, or (2) forming one or more support elements of the plurality of support elements on one or more pads of the plurality of pads. In particular, if a spring element is formed first on the pad, next a support element may be formed on a second end of the spring element. Likewise, if first a support element is formed first on the pad next, one or more spring elements may be formed on the support element to form the interconnect device.

Optionally, in instances where the spring elements are formed on the pads, and support elements having the first and second surfaces are formed on the spring elements, another spring element may be formed on other surface of the support element. Similarly, in instances where the support elements are formed on the pads, and spring elements are formed on the support elements, another support element may be formed on other end of the spring element.

In one embodiment, the interconnect device may be formed using a glancing angle deposition (GLAD) process. In certain embodiments, the GLAD process may be used to provide a pattern of support elements and/or spring elements to match a pattern of pads on a surface of the substrate. In one example, the pattern of the pads may be a pattern of the pads of the semiconductor integrated circuit.

Whether the interconnect device is formed on the substrate of the semiconductor device, the substrate of the integrated circuit, or the substrate of the external article, a positioning of individual interconnects of the plurality of interconnect components may be controlled by controlling a position of nucleation centers of the substrate. Further, a size of the spring element or the support element may depend on a size of a nucleation center. In some embodiments, nucleation centers may be formed by depositing a polystyrene colloid film on a monolayer which comprises domains and depletion areas. Colloid defects may be defined in the depletion areas. The defects can serve as nucleation centers during glancing angle deposition (GLAD).

A cross sectional shape and morphology of the individual components grown using the GLAD process may be controlled by controlling one or more GLAD input controls including oblique angle of deposition and substrate positional control. A cross-sectional shape of a GLAD formed column may be controlled by controlling an angle of incidence by controlling a ratio of a deposition rate to a substrate rotation rate. Further, column morphology may be controlled e.g., to form spring shaped (helical) columns as set forth in various embodiments herein. In other embodiments, columns formed as interconnects can be cylindrical or matchstick in morphology.

Although described primarily with respect to the GLAD process, in some embodiments, the interconnect components may be formed on the substrate or coupled to the substrate using one or more processes other than the GLAD process. Non-limiting example of the one or more processes may include electro deposition, plasma deposition, chemical vapor deposition (CVD), physical vapor deposition (PVD), sol-gel, micromachining, laser ablation, rapid prototyping, sputtering, or any combination of these processes. In one of these embodiments, the plurality of interconnect components may be disposed using the CVD deposition.

Further, at step 710, one or more interconnect components may be coupled to the first substrate and/or the second substrate. In one example, a distal end (e.g., the second end) of the spring elements or a distal surface (e.g., the second surface) of the support elements may be coupled to a second substrate. In one example, the first substrate may be a substrate of a semiconductor device, an integrated circuit, an external article, or combinations thereof. In the same or different example, the second substrate may be a substrate of a semiconductor device, an integrated circuit, an external article, or combinations thereof. In a non-limiting example, the first substrate may be a substrate of the integrated circuit, where the integrated circuit is coupled to the semiconductor device, further, the second substrate may be a substrate of the external article. In one embodiment, the interconnect components may be coupled to the first and/or second substrates using thermal pressure bonding, soldering, or combinations thereof.

Advantageously, the interconnect device may be configured to provide flexibility to the electronic assembly during the reflow flow process. Further, while the support elements are configured to provide rigidity and structure to the interconnect device and the electronic packaging assembly, the spring elements are configured to provide flexibility and tolerance to the interconnect device.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. An electronic packaging assembly, comprising:

a semiconductor [integrated circuit] *device*;

a plurality of interconnect components operatively coupled to the semiconductor [integrated circuit] *device*, wherein one or more interconnect components comprise:

at least one support element having a first surface and a second surface; and

[a] first and [a] second nano-spring elements *each* having a first end and a second end, and wherein [first ends of the first and the second nano-spring elements are coupled to the first surface and] *the first end of the first nano-spring element is coupled to the first surface of one support element and the first end of the second nano-spring element is coupled to* the second surface of [a same] *the one* support element and, wherein said nano-spring elements are less than 10 microns in one dimension*;*

*wherein the at least one support element comprises a pillar structure, a bump structure, a tubular structure, a columnar structure, or combinations thereof.*

2. The electronic packaging assembly of claim 1, wherein the at least one support [elements] *element* and the first and second nano-spring elements are made of electrically and thermally conductive materials.

3. The electronic packaging assembly of claim 1, further comprising a coupling layer disposed on *at least one of* the first surface and[,] the second surface of the *one* support element, wherein the coupling layer is configured to couple the first surface or the second surface of the *one* support element to the first end of the *first* nano-spring [spring] element *or the first end of the second nano-spring element*.

4. The electronic packaging assembly of claim 1, wherein the second [end] *ends* of the first and the second nano-spring elements [comprises] *comprise* a cap.

[5. The electronic packaging assembly of claim 1, wherein the support element comprise a pillar structure, a bump structure, a tubular structure, a columnar structure, or combinations thereof.]

6. The electronic packaging assembly of claim 1, wherein [two] *one* or more [spring] *additional nano-spring* elements [nano-spring] are coupled to the first surface or the second surface of a respective support element.

7. The electronic packaging assembly of claim 1, wherein the first and second nano-spring elements comprise an average diameter of equal to or less than about 550 nm.

8. The electronic packaging assembly of claim 1, wherein the semiconductor [integrated circuit] *device* comprises a light emitting diode, a laser, or both.

9. The electronic packaging assembly of claim 1, wherein *the at least one support element comprises a cylindrical element having* a [diamater of the support element] *diameter that* is about 50% of a pitch of the *plurality of* interconnect [device] *components*.

10. An electronic packaging assembly, comprising:

a semiconductor device;

an interconnect device operatively coupled to the semiconductor device, wherein the interconnect device comprises a plurality of interconnect components, wherein [one] *two* or more *of the plurality of* interconnect components [comprise] *each comprises*:

[a plurality of support elements] *at least one support element*, wherein each support element of the [plurality of support elements] *at least one support element* comprises a first surface and a second surface; *and* a plurality of nano-spring elements, wherein each nano-spring element of the plurality of nano-spring elements comprises a first end and a second end, and wherein a first [and a second] *nano-spring element of the plurality of* nano-spring elements [are] *is* coupled to the first surface [and] *of one support element, and wherein a second nano-spring element of the plurality of nano-spring elements is coupled to* the second surface of the *one* support element; and an external article operatively coupled to the interconnect device such that the plurality of interconnect components of the interconnect device extend between the semiconductor device and the external article*;*

*wherein the at least one support element of a respective interconnect component of the two or more of the plurality of interconnect components is separate from the at least one support element of another respective interconnect component of the two or more of the plurality of interconnect components.*

11. The electronic packaging assembly of claim 10, [further comprising] *wherein the semiconductor device comprises* an integrated interconnect circuit, wherein the integrated interconnect circuit comprises a flip chip, a ball grid array, a multi chip module, a stacked die, or combinations thereof.

12. The electronic packaging assembly of claim 11, wherein the stacked die comprises vertically stacked die.

13. The electronic packaging assembly of claim 10, wherein the semiconductor device comprises a microprocessor, a microprocessor integrated circuit, a semiconductor integrated circuit, a laser, a light emitting diode, or combinations thereof.

14. The electronic packaging assembly of claim 13, further comprising an integrated interconnect circuit, wherein the integrated interconnect circuit is disposed between the interconnect device and the semiconductor device, or the interconnect device and the external article, or both.

15. The electronic packaging assembly of claim 10, wherein the interconnect device further comprises other spring elements, bumps, micro-bumps, underfill material, or combinations thereof.

16. The electronic packaging assembly of claim 10, wherein the interconnect device further comprises a coupling layer disposed on the second [end] *ends* of the first and second nano-spring elements.

*17. An electronic packaging assembly comprising:*

*a semiconductor device;*

*an external article;*

*a plurality of interconnect components disposed between the semiconductor device and the external article, wherein two or more of the plurality of interconnect components each comprises:*

*at least one support element; and*

*at least one spring element coupled to the at least one support element; and*

*at least one interface layer disposed between the plurality of interconnect components and the semiconductor device;*

*wherein the at least one support element of a respective interconnect component of the two or more of the plurality of interconnect components is separate from the at least one support element of another respective*

*interconnect component of the two or more of the plurality of interconnect components.*

*18. The electronic packaging assembly of claim 17 wherein each of the plurality of interconnect components are coupled to a respective pad of the at least one interface layer.*

*19. The electronic packaging assembly of claim 17 further comprising at least another interface layer disposed between the plurality of interconnect components and the external article.*

*20. The electronic packaging assembly of claim 17 wherein the at least one interface layer is configured to facilitate coupling, thermal conductivity, electrical conductivity, or combinations thereof between the plurality of interconnect components and the semiconductor device.*

*21. The electronic packaging assembly of claim 17 wherein the at least one interface layer comprises an electrically and thermally conductive adhesive material.*

*22. An electronic packaging assembly comprising:*

*a light emitting device;*

*a first interconnect device comprising a first plurality of interconnect components, at least one of the first plurality of interconnect components comprising:*

*a support element having a first surface coupled to the light emitting device so as to be in direct contact therewith; and*

*at least one spring element having a first end coupled to a second surface of the support element; and*

*a substrate coupled to a second end of the at least one spring element.*

*23. The electronic packaging assembly of claim 22 wherein the light emitting device comprises a light emitting diode.*

*24. The electronic packaging assembly of claim 22 wherein the light emitting device comprises a laser.*

*25. The electronic packaging assembly of claim 22 further comprising:*

*a thermo-electric cooler; and*

*a second interconnect device comprising a second plurality of interconnect components;*

*wherein the substrate is coupled to the second end of the at least one spring element by way of the thermo-electric cooler and the second interconnect device.*

*26. The electronic packaging assembly of claim 25 wherein the second plurality of interconnect components comprise a plurality of support elements coupled to the thermo-electric cooler and a plurality of spring elements coupling the plurality of support elements to the substrate.*

* * * * *